United States Patent
Feng et al.

(10) Patent No.: US 11,233,038 B2
(45) Date of Patent: Jan. 25, 2022

(54) LIGHT EMITTING DIODE DISPLAY SUBSTRATE, MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiang Feng, Beijing (CN); Sha Liu, Beijing (CN); Ruizhi Yang, Beijing (CN); Xiao Sun, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 875 days.

(21) Appl. No.: 16/062,665

(22) PCT Filed: Oct. 20, 2017

(86) PCT No.: PCT/CN2017/107058
§ 371 (c)(1),
(2) Date: Jun. 15, 2018

(87) PCT Pub. No.: WO2018/157610
PCT Pub. Date: Sep. 7, 2018

(65) Prior Publication Data
US 2021/0175220 A1   Jun. 10, 2021

(30) Foreign Application Priority Data
Mar. 3, 2017   (CN) .................. CN201710124799

(51) Int. Cl.
*H01L 25/16* (2006.01)
*H01L 33/00* (2010.01)
(Continued)

(52) U.S. Cl.
CPC ............ *H01L 25/167* (2013.01); *H01L 24/29* (2013.01); *H01L 24/32* (2013.01); *H01L 24/83* (2013.01);
(Continued)

(58) Field of Classification Search
None
See application file for complete search history.

(56) References Cited

U.S. PATENT DOCUMENTS

2011/0309336 A1* 12/2011 Shin .................. H01L 21/28255
257/29
2017/0018734 A1*  1/2017 Feng ....................... H01L 51/56

FOREIGN PATENT DOCUMENTS

CN   102169963 A    8/2011
CN   103021574 A    4/2013
(Continued)

OTHER PUBLICATIONS

International Search Report and Written Opinion in corresponding International Patent Application No. PCT/CN2017/107058, dated Jan. 29, 2018. English translation attached. 20 pages.
(Continued)

*Primary Examiner* — Robert K Carpenter
(74) *Attorney, Agent, or Firm* — Leason Ellis LLP (57) ABSTRACT

A light emitting diode display substrate, a manufacturing method thereof, and a display device are provided. The light emitting diode display substrate includes a base substrate; a light emitting diode located on the base substrate, and a self-assembled monolayer. The light emitting diode includes a graphene layer, and the graphene layer is located on a side of the light emitting diode close to the base substrate; the self-assembled monolayer is located between the graphene layer and the base substrate and connected with the graphene layer.

18 Claims, 4 Drawing Sheets

(51) Int. Cl.
  *H01L 33/40* (2010.01)
  *H01L 33/54* (2010.01)
  *H01L 23/00* (2006.01)
  *H01L 33/32* (2010.01)

(52) U.S. Cl.
  CPC .......... *H01L 33/0093* (2020.05); *H01L 33/40* (2013.01); *H01L 33/54* (2013.01); *H01L 33/32* (2013.01); *H01L 2224/29193* (2013.01); *H01L 2224/32145* (2013.01); *H01L 2224/83894* (2013.01); *H01L 2933/005* (2013.01); *H01L 2933/0016* (2013.01)

(56) References Cited

FOREIGN PATENT DOCUMENTS

| | | | | |
|---|---|---|---|---|
| CN | 102201503 A | | 1/2014 | |
| CN | 103579255 A | | 2/2014 | |
| CN | 103646855 A | | 3/2014 | |
| CN | 104966792 A | * | 10/2015 | ........... H01L 27/323 |
| CN | 105449067 A | | 3/2016 | |
| CN | 106816512 A | | 6/2017 | |
| KR | 20140071844 A | | 6/2014 | |

OTHER PUBLICATIONS

Chinese Office Action in corresponding Chinese Application No. 201710124799.9, dated Jul. 3, 2018. English translation attached. 14 pages.

* cited by examiner

LIGHT EMITTING DIODE DISPLAY SUBSTRATE, MANUFACTURING METHOD THEREOF, AND DISPLAY DEVICE

CROSS-REFERENCE TO RELATED PATENT APPLICATIONS

The present application is a U.S. National Stage Application under 35 U.S.C. § 371 of International Patent Application No. PCT/CN2017/107058, filed Oct. 20, 2017, which claims priority of China Patent application No. 201710124799.9 filed on Mar. 3, 2017, the content of which is incorporated in their entirety as portion of the present application by reference herein.

TECHNICAL FIELD

At least one embodiment of the present disclosure relates to a light emitting diode display substrate, a manufacturing method thereof, and a display device.

BACKGROUND

LED (Light Emitting Diode) is a semiconductor electronic element that can emit light, has the features of small volume, high brightness, and low power consumption, has been widely applied to a display screen, a backlight source, a lighting device, and other display fields. Micro LED has the features such as low driving voltage, power saving, and high brightness, and thus has enormous potential in the display technology.

SUMMARY

At least one embodiment of the present disclosure provides a light emitting diode display substrate, a manufacturing method thereof, and a display device. At one aspect, the light emitting diode display substrate utilizes a lattice matching feature of graphene and gallium nitride to contribute to growing gallium nitride on a transfer substrate, and because graphene is a conductive material, and the hardness and the flexibility thereof are both relatively good, the graphene layer can not only serve as a substrate or an electrode, but also serve as a medium for performing a roll-to-roll carrier transferring process. At another aspect, the self-assembled monolayer and the graphene layer are connected by a chemical bond, thereby increasing the connection strength between the light emitting diode and the base substrate.

At least one embodiment of the present disclosure provides a light emitting diode display substrate, the light emitting diode display substrate includes a base substrate; a light emitting diode located on the base substrate, and a self-assembled monolayer located between the light emitting diode and the base substrate. The light emitting diode includes a graphene layer, and the graphene layer is located on a side of the light emitting diode close to the base substrate; and the self-assembled monolayer is located between the graphene layer and the base substrate and connected with the graphene layer.

For example, in an embodiment of the present disclosure, the self-assembled monolayer includes at least one type of organic molecule, two ends of the organic molecule include an azide functional group and an amino functional group respectively, and the azide functional group and a graphene molecule in the graphene layer are connected by a chemical bond.

For example, in an embodiment of the present disclosure, the organic molecule includes 4-diazo-2,3,5,6-tetrafluorobenzoic acid ethylamine.

For example, in an embodiment of the present disclosure, the light emitting diode display substrate further includes an organic film, located between the self-assembled monolayer and the base substrate, and connected with the amino functional group in the self-assembled monolayer by a hydrogen bond.

For example, in an embodiment of the present disclosure, the light emitting diode further includes a semiconductor layer located at a side of the graphene layer away from the self-assembled monolayer and a conductive layer located at a side of the semiconductor layer away from the graphene layer.

For example, in an embodiment of the present disclosure, the semiconductor layer is a gallium nitride based semiconductor layer.

For example, in an embodiment of the present disclosure, the light emitting diode display substrate further includes a protection layer, located on a part of an upper surface of the conductive layer away from the semiconductor layer.

For example, in an embodiment of the present disclosure, the graphene layer includes a protrusion portion extending beyond the semiconductor layer in a first direction parallel to the base substrate, and the protection layer is located on a lateral side of the semiconductor layer and connected to the protrusion portion of the graphene layer.

For example, in an embodiment of the present disclosure, the light emitting diode display substrate further includes a thin film transistor, the thin film transistor includes a drain electrode, and the drain electrode is electrically connected with the graphene layer.

For example, in an embodiment of the present disclosure, the light emitting diode has a size in a range from 1 μm to 100 μm.

At least one embodiment of the present disclosure provides a manufacturing method of a light emitting diode display substrate, including: forming a graphene layer on a transfer substrate; forming a semiconductor layer and a conductive layer sequentially at a side of the graphene layer away from the transfer substrate to form a light emitting diode; forming a self-assembled monolayer on a base substrate; and transferring the light emitting diode from the transfer substrate to the self-assembled monolayer, to connect the graphene layer to the self-assembled monolayer.

For example, in an embodiment of the present disclosure, the self-assembled monolayer includes at least one type of organic molecule, two ends of the organic molecule include an azide functional group and an amino functional group respectively.

For example, in an embodiment of the present disclosure, wherein, before transferring the light emitting diode from the transfer substrate, the method includes: forming a protection layer on a part of an upper surface of the conductive layer away from the semiconductor layer.

For example, in an embodiment of the present disclosure, the graphene layer includes a protrusion portion extending beyond the semiconductor layer in a first direction parallel to the transfer substrate, wherein, before transferring the light emitting diode from the transfer substrate, the method further includes: forming the protection layer on a lateral side of the semiconductor layer and the protrusion portion of the graphene layer.

For example, in an embodiment of the present disclosure, transferring the light emitting diode from the transfer substrate to the self-assembled monolayer includes: absorbing the protection layer by a transfer device to take away the light emitting diode from the transfer substrate and place it on the self-assembled monolayer, and heating the self-assembled monolayer to connect the azide functional group and a graphene molecule of the graphene layer by a chemical bond.

For example, in an embodiment of the present disclosure, forming the self-assembled monolayer on the base substrate includes: forming an organic film on the base substrate, performing a treatment to a surface of the organic film, and forming the self-assembled monolayer on the organic film to connect the amino functional group in the self-assembled monolayer and the organic film by a hydrogen bond.

For example, in an embodiment of the present disclosure, transferring the light emitting diode to the self-assembled monolayer by a roll-to-roll process.

At least one embodiment of the present disclosure provides a display device, including the light emitting diode display substrate according to any one of the abovementioned embodiments.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 2b is a schematic diagram of a bonding mechanism of a molecular formula of the self-assembled monolayer shown in FIG. 2a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, a person having ordinary skill in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "comprise," "comprising," etc., are intended to specify that the elements or the objects stated before these terms encompass the elements or the objects and equivalents thereof listed after these terms, but do not preclude the other elements or objects. "On," "under," "left," "right" and the like are only used to indicate relative position relationship, and when the resolute position of the object which is described is changed, the relative position relationship may be changed accordingly.

Embodiments of the present disclosure provide a light emitting diode display substrate, a manufacturing method thereof, and a display device. The light emitting diode display substrate includes a base substrate, a light emitting diode located on the base substrate, and a self-assembled monolayer located between the light emitting diode and the base substrate. The light emitting diode includes a graphene layer, and the graphene layer is located on the side of the light emitting diode close to the base substrate. The self-assembled monolayer is located between the graphene layer and the base substrate and is connected with the graphene layer. At one aspect, the light emitting diode display substrate utilizes a lattice matching feature of graphene and gallium nitride to contribute to growing gallium nitride on a transfer substrate, and because graphene is a conductive material, and the hardness and the flexibility are both relatively good, the graphene layer can not only serve as a substrate or an electrode, but also serve as a medium for performing a roll-to-roll carrier transferring process as well. At another aspect, the self-assembled monolayer and the graphene layer are connected by a chemical bond, thereby increasing the connection strength between the light emitting diode and the base substrate.

Hereafter, the light emitting diode display substrate, the manufacturing method thereof, and the display device provided by embodiments of the present disclosure will be described with reference to the accompanying drawings.

Figure 1:
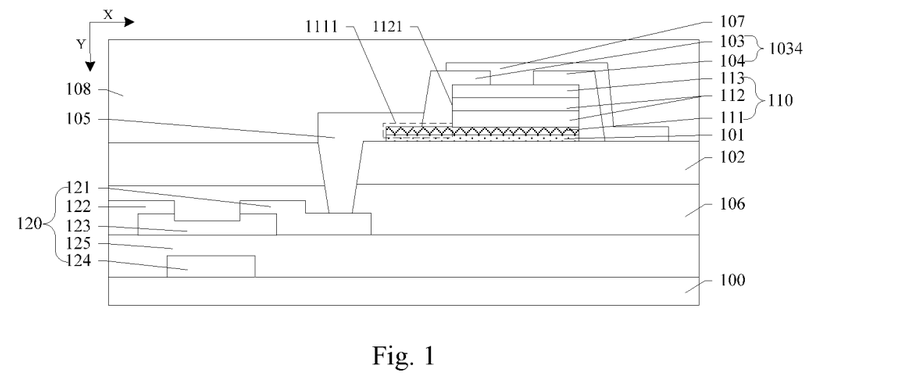
FIG. 1 is a schematic diagram of a light emitting diode display substrate provided by an embodiment of the present disclosure.

An embodiment of the present disclosure provides a light emitting diode display substrate. As illustrated by FIG. 1, the light emitting diode display substrate includes a base substrate 100, a light emitting diode 110 located on the base substrate 100, and a self-assembled monolayer 101 located between the light emitting diode 110 and the base substrate 100. The light emitting diode 110 includes a graphene layer 111, and the graphene layer 111 is located on a side of the light emitting diode 110 close to the base substrate 100. The self-assembled monolayer 101 provided between the graphene layer 111 and the base substrate 100 is connected to the graphene layer 111 by a chemical bond. The light emitting diode display substrate provided by the present embodiment adopts a new connection method that the light emitting diode and the base substrate are connected by a chemical bond, which can increase the connection strength between the light emitting diode and the base substrate, i.e., the connection strength between the light emitting diode and the base substrate can be increased by a connection method that the self-assembled monolayer and the graphene layer are connected by a chemical bond. At another aspect, the light emitting diode display substrate utilizes a lattice matching feature of graphene and gallium nitride to contribute to growing gallium nitride on a transfer substrate, and graphene is a conductive material and has good hardness and flexibility, therefore, the graphene layer can not only serve as a substrate, but also serve as an electrode.

A case that the base substrate 100 is provided with one light emitting diode 110 thereon illustrated by FIG. 1 is only schematic. The base substrate 100 can be provided with a plurality of light emitting diodes 110 thereon, and the plurality of light emitting diodes 110 can be disposed on the base substrate 100 in an array. The plurality of light emitting diodes 110 can emit light of different colors or light of the same color, and the embodiments of the present disclosure are not particularly limited thereto.

For example, as illustrated by FIG. 1, the present embodiment is described by taking a case where an orthographic projection of the graphene layer 111 on the base substrate 100 completely falls into an orthographic projection of the self-assembled monolayer 101 on the base substrate 100 as an example. The present embodiment includes but is not limited thereto, for example, the orthographic projection of the self-assembled monolayer on the base substrate can completely fall into the orthographic projection of the graphene layer on the base substrate.

For example, the base substrate 100 can be made of one or more selected from the group consisting of sapphire, silicon, gallium arsenide, silicon carbide, aluminum nitride, gallium nitride, polyimide, polycarbonate, polyacrylate, polyetherimide, polyether sulfone, polyethylene terephthalate and polyethylene naphthalate, and the present embodiment is not limited thereto.

For example, as illustrated by FIG. 1, the light emitting diode display substrate provided by the present embodiment further includes an organic film 102. The organic film 102 is located between the self-assembled monolayer 101 and the base substrate 100, and the organic film 102 and the self-assembled monolayer 101 are connected by a chemical bond.

For example, a material of the organic film 102 can include polyimide, polycarbonate, polyacrylate, or the like, and the present embodiment is not limited thereto.

Figure 2A:
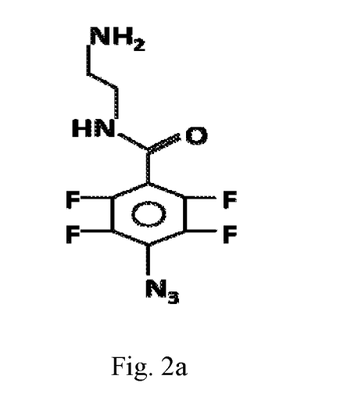
FIG. 2a is a schematic diagram of a molecular formula of a self-assembled monolayer provided by an embodiment of the present disclosure.

For example, the self-assembled monolayer 101 includes at least one type of organic molecule, and two ends of the organic molecule include an azide functional group ($-N_3$) and an amino functional group ($-NH_2$), respectively. FIG. 2a is a schematic diagram of a molecular formula of a self-assembled monolayer. As illustrated by FIG. 2a, the self-assembled monolayer includes 4-diazo-2,3,5,6-tetrafluorobenzoic acid ethylamine (TFPA-$NH_2$). The present embodiment includes but is not limited thereto. It should be noted that, the present embodiment is described by taking a case where the two ends of each molecule in the self-assembled monolayer include an azide functional group ($-N_3$) and an amino functional group ($-NH_2$) respectively as an example. The present embodiment includes but is not limited thereto. For example, the self-assembled monolayer can include other molecules.

Figure 2B:
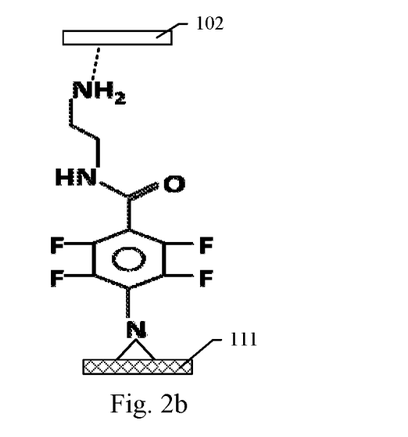

FIG. 2b is a schematic diagram of a bonding mechanism of a molecular formula of the self-assembled monolayer shown in FIG. 2a. As illustrated by FIG. 2b, the azide functional group in the self-assembled monolayer (the present embodiment is described by taking TFPA-$NH_2$ as an example) and a six-membered ring of the graphene molecule in the graphene layer 111 are connected by a chemical bond.

For example, the azide functional group can be activated by heating to form a covalent bond with a carbon six-membered ring in a graphene molecule. The present embodiment includes but is not limited thereto.

As illustrated by FIG. 2b, for example, the organic film 102 and the amino functional group in the self-assembled monolayer are connected by the chemical bond.

For example, a surface of the organic film 102 is subjected to an oxygen plasma treatment to produce active groups (for example, —H), the active groups are connected with the self-assembled monolayer by an effect of a hydrogen bond (as shown by the dotted line in FIG. 2b), and the present embodiment includes but is not limited thereto. The self-assembled monolayer between the graphene layer and the organic film in the present embodiment is a functional layer, which serves as a connection medium between the light emitting diode and the base substrate in a form of the self-assembled monolayer. That is, two ends of the self-assembled monolayer are respectively bonded to the graphene layer and the organic film to form covalent bonds, thereby increasing the connection strength between the light emitting diode and the base substrate, and having good mechanical reliability.

For example, as illustrated by FIG. 1, the light emitting diode 110 further includes a semiconductor layer 112 located on the graphene layer 111 and a conductive layer 113 located on the semiconductor layer 112.

For example, the semiconductor layer 112 is a gallium nitride based semiconductor layer.

For example, the present embodiment is described by taking a case where the semiconductor layer 112 includes an N-type semiconductor layer and a P-type semiconductor layer as an example. That is, the present embodiment is described by taking a case where the semiconductor layer close to the graphene layer 111 is an N-type semiconductor layer, for example, a material of the N-type semiconductor layer can include N-type GaN, but the present embodiment is not limited thereto. The present embodiment takes a case where the semiconductor layer close to the conductive layer 113 is a P-type semiconductor layer as an example. For example, a material of the P-type semiconductor layer can include P-type GaN, but the present embodiment is not limited thereto. Holes and electrons are respectively injected into the P-type semiconductor layer and the N-type semiconductor layer from the conductive layer 113 and the graphene layer 111, and are recombined at a contact surface of the two semiconductor layers, and energy is released in a form of photons. An emission wavelength depends on a bandgap of a luminescent material. The present embodiment includes but is not limited thereto. For example, the semiconductor layer close to the graphene layer 111 can also be a P-type semiconductor layer, and the semiconductor layer close to the conductive layer 113 can also be an N-type semiconductor layer.

For example, a material of the conductive layer 113 is a transparent conductive material, which can include, for example, at least one or a combination of ones selected from the group consisting of indium tin oxide (ITO), indium zinc oxide (IZO), zinc oxide (ZnO), indium oxide ($In_2O_3$), and indium gallium oxide (IGO). The present embodiment is not limited thereto. It should be noted that, the present embodiment is described by taking a case where an orthographic projection of the conductive layer on the base substrate and an orthographic projection of the semiconductor layer on the base substrate are completely overlapped as an example. That is, the present embodiment is described by taking a case where the conductive layer is an entire surface electrode as an example. The present embodiment includes but is not limited thereto.

For example, the conductive layer can also be a block electrode, and a material of the conductive layer can be either a transparent conductive material or an opaque conductive material. For example, a material of the opaque conductive layer can be one or more selected from the group consisting of titanium (Ti), platinum (Pt), gold (Au) and chromium (Cr). The present embodiment is not limited thereto.

For example, the light emitting diode can further include a light emitting layer (not shown in FIG. 1). The light emitting layer is located between the two semiconductor layers. Holes and electrons are respectively injected into the light emitting layer from the two semiconductor layers, and are recombined at the light emitting layer, and energy is released in the form of photons.

For example, the light emitting layer can be a single quantum well (SQW) light emitting layer or a multiple quantum well (MQW) light emitting layer, i.e., the structure of the light emitting layer is a quantum well which can localize a carrier. The present embodiment includes but is not limited thereto. For example, the light emitting layer can also be a quantum dot light emitting layer. The light emitting layer can emit light of different colors according to different materials which are selected. For example, a material of the light emitting layer of a red light emitting diode can be one or more selected from the group consisting of gallium aluminum arsenide, gallium phosphor arsenide, and gallium phosphide; a material of the light emitting layer of a green light emitting diode can be one or more selected from the group consisting of gallium indium nitride/gallium nitride, gallium phosphide, and gallium aluminum phosphide; a material of the light emitting layer of a blue light emitting diode can be one or more selected from the group consisting of gallium nitride, gallium indium nitride, and zinc selenide. The present embodiment is not limited thereto.

For example, the structure of the light emitting diode in the present embodiment is not limited thereto, and can further include a current dispersion layer, a current blocking layer, an intermediate blocking layer, a buffer layer, and the like.

For example, as illustrated by FIG. 1, a part of an upper surface of the conductive layer 113 is provided with a protection layer 1034. The protection layer 1034 in the present embodiment includes two portions including a first protection layer 103 and a second protection layer 104. The first protection layer 103 plays a protection role on the light emitting diode 110 during a process of transferring the light emitting diode 110, that is, during the process of transferring the light emitting diode 110 from a transfer substrate to the base substrate 100, the first protection layer 103 is absorbed by a transfer device to take away the light emitting diode 110 from the transfer substrate. The second protection layer 104 is configured to protect the graphene layer 111 so as to prevent the graphene layer 111 from being electrically connected to a subsequently formed common electrode 107.

For example, a thickness of an entirety of the protection layer 1034 and the light emitting diode 110 in the Y direction is 3-4 micrometers. The present embodiment includes but is not limited thereto.

For example, as illustrated by FIG. 1, the graphene layer 111 in the present embodiment includes a protrusion portion 1111 extending beyond the semiconductor layer 112 in a first direction (X direction as illustrated by FIG. 1) parallel to the base substrate 100.

For example, the present embodiment is described by taking a case where the first protection layer 103 includes, in addition to the portion located on a part of the upper surface of the conductive layer 113, another portion located on a lateral side 1121 of the semiconductor layer 112 and connected to the protrusion portion 1111 of the graphene layer 111 as an example, but is not limited thereto. For example, the first protection layer can also be located only on a part of the upper surface of the conductive layer or the first protection layer can also be located on a part of the upper surface of the conductive layer and a lateral side of the semiconductor layer.

For example, as illustrated by FIG. 1, the second protection layer 104 is located on another lateral side opposite to the lateral side 1121 of the semiconductor layer 112 in the X direction, so as to prevent the graphene layer 111 from being electrically connected to the subsequently formed common electrode 107. It should be noted that, the present embodiment is described by taking a case where the second protection layer is located on a part of the upper surface the conductive layer and lateral sides of the semiconductor layer and the graphene layer as an example. The present embodiment is not limited thereto.

For example, upon the conductive layer being a block electrode, the second protection layer can also be located on a part of the upper surface of the semiconductor layer and lateral sides of the semiconductor layer and the graphene layer, and the other positions.

For example, a material of the protection layer 1034 can be a transparent organic material such as a photoresist. The present embodiment includes but is not limited thereto.

For example, as illustrated by FIG. 1, the light emitting diode display substrate further includes a thin film transistor 120. The thin film transistor 120 includes a drain electrode 121, a source electrode 122, an active layer 123, a gate electrode 124, and a gate insulating layer 125. The drain electrode 121 is electrically connected with the graphene layer 111, that is, the graphene layer 111 serves as an electrode of the light emitting diode 110. Upon the graphene layer 111 being served as an electrode of the light emitting diode 110, the protrusion portion 1111 thereof is electrically connected to the drain electrode 121 through a contact electrode 105. In a case where the thin film transistor 120 is turned on, current of the source electrode 122 is transmitted to the graphene layer 111 of the light emitting diode 110 through the drain electrode 121. The present embodiment includes but is not limited thereto. For example, another electrode can be further disposed on the graphene layer to be electrically connected with the drain electrode of the thin film transistor, and the graphene layer only serves as a substrate for forming the light emitting diode and is transferred to the base substrate together with the light emitting diode.

For example, as illustrated by FIG. 1, the light emitting diode display substrate further includes a common electrode 107. The common electrode 107 is electrically connected with the conductive layer 113 of the light emitting diode 110.

For example, a material of the common electrode 107 is a transparent conductive material, and can include, for example, at least one or a combination of ones selected from the group consisting of indium tin oxide (ITO), indium zinc oxide (IZO), zinc oxide (ZnO), indium oxide ($In_2O_3$), and indium gallium oxide (IGO). The present embodiment is not limited thereto.

For example, as illustrated by FIG. 1, the light emitting diode display substrate further includes an encapsulation layer 108.

For example, a material of the encapsulation layer 108 can include silicon dioxide, but the present embodiment is not limited thereto. For example, the material of the encapsulation layer 108 can also include a transparent organic material or the like.

For example, a thickness of the encapsulation layer 108 in the Y direction is not less than an overall thickness of the light emitting diode 110 and the protection layer 1034 in the Y direction, that is, the thickness of the encapsulation layer 108 in the Y direction is not less than 3-4 micrometers. The present embodiment is not limited thereto.

For example, each of the plurality of light emitting diodes 120 has a size in a range from several micrometers to tens of micrometers. For example, each of the light emitting diodes 120 has a size in a range from 1 micrometer to 100 micrometers, that is, the light emitting diodes 120 are micro light emitting diodes. The present embodiment is not limited thereto.

Figure 3:
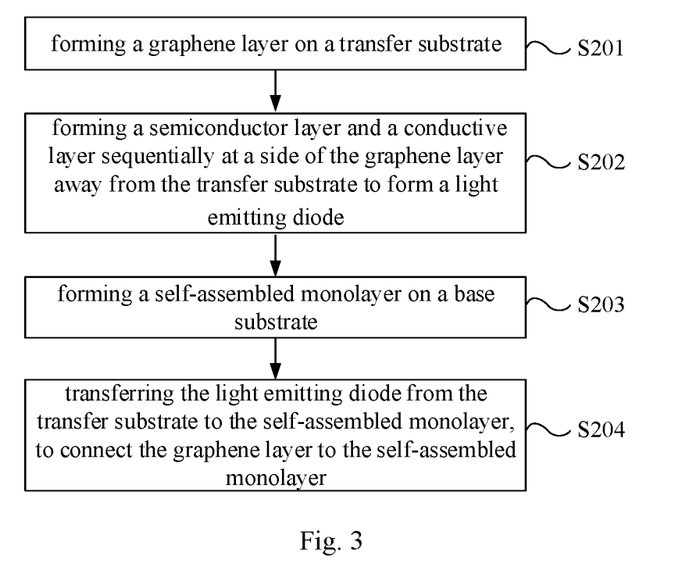
FIG. 3 is a schematic diagram of specific steps of a manufacturing method of a light emitting diode display substrate provided by an embodiment of the present disclosure.

An embodiment of the present disclosure provides a manufacturing method of a light emitting diode display substrate. The specific steps of the manufacturing method of a light emitting diode display substrate are illustrated by FIG. 3, and include:

S201: forming a graphene layer on a transfer substrate.

FIGS. 4a to 4d are flow diagrams of forming a light emitting diode according to the present embodiment. As illustrated by FIG. 4 a, for example, forming a graphene layer 111 on the transfer substrate 130.

Figure 4A:
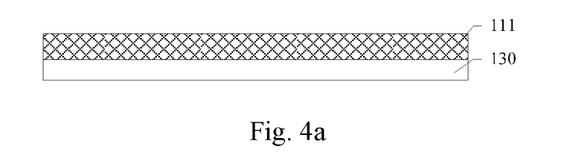
FIGS. 4a to 4d are flow diagrams of forming a light emitting diode provided by an embodiment of the present disclosure.

For example, a chemical vapor deposition method can be adopted to grow a graphene film on a substrate such as a copper sheet, and the graphene film can be peeled off from the substrate such as a copper sheet by a thermal release tape-etching, an ultraviolet curing-etching, an electrolytic bubble stripping, or a dry etching method, and be transferred to the transfer substrate 130, the present embodiment includes but is not limited thereto.

For example, a material of the transfer substrate 130 can be sapphire, but the present embodiment is not limited thereto, and other transfer substrates which do not produce a chemical bond with the graphene layer and are connected with the graphene layer by a weak van der Waals force can be adopted. Besides, a lattice structure the material of the transfer substrate is similar to a lattice structure of graphene and gallium nitride. The present embodiment is not limited thereto.

S202: forming a semiconductor layer and a conductive layer sequentially at a side of the graphene layer away from the transfer substrate to form a light emitting diode.

Figure 4B:
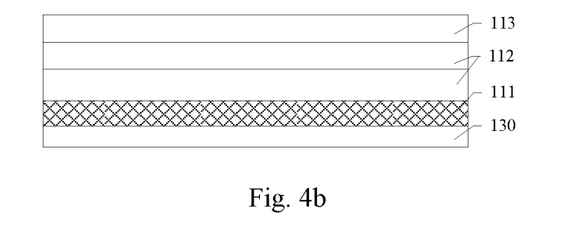

As illustrated by FIG. 4b, for example, a semiconductor layer 112 and a conductive layer 113 are formed on the graphene layer 111, i.e., a light emitting diode crystal is grown on a composite substrate of sapphire and graphene. The present embodiment is described by taking a case where the semiconductor layer 112 includes an N-type semiconductor layer and a P-type semiconductor layer as examples. That is, the present embodiment is described by taking a case where the semiconductor layer close to the graphene layer 111 is an N-type semiconductor layer, for example, the material of the N-type semiconductor layer can include N-type GaN, but the present embodiment is not limited thereto. The present embodiment takes a case where the semiconductor layer close to the conductive layer 113 is a P-type semiconductor layer as an example. For example, the material of the P-type semiconductor layer can include P-type GaN, but the present embodiment is not limited thereto. Holes and electrons are respectively injected into the P-type semiconductor layer and the N-type semiconductor layer from the conductive layer 113 and the graphene layer 111, and are recombined at a contact surface of the two semiconductor layers, and energy is released in a form of photons. An emission wavelength depends on a bandgap of a luminescent material. The present embodiment includes but is not limited thereto. For example, the semiconductor layer close to the graphene layer 111 can also be a P-type semiconductor layer, and the semiconductor layer close to the conductive layer 113 can also be an N-type semiconductor layer.

In the present embodiment, a gallium nitride crystal is grown on the graphene layer, and the gallium nitride crystal can be grown by taking a six-membered ring of the graphene molecule as a "template", and thus the shape of the grown gallium nitride crystal lattice is relatively standardized.

For example, a material of the conductive layer 113 is a transparent conductive material, which can include, for example, at least one or a combination of ones selected from the group consisting of indium tin oxide (ITO), indium zinc oxide (IZO), zinc oxide (ZnO), indium oxide ($In_2O_3$), and indium gallium oxide (IGO). The present embodiment is not limited thereto.

For example, a light emitting layer (not shown in FIG. 4b) can also be formed between two semiconductor layers. Holes and electrons are injected into the light emitting layer from two semiconductor layers, respectively, and are recombined in the light emitting layer, and energy is released in a form of photons.

For example, the light emitting layer can be a single quantum well (SQW) light emitting layer or a multiple quantum well (MQW) light emitting layer, i.e., the structure of the light emitting layer is a quantum well which can localize a carrier. The present embodiment includes but is not limited thereto. For example, the light emitting layer can also be a quantum dot light emitting layer.

Figure 4C:
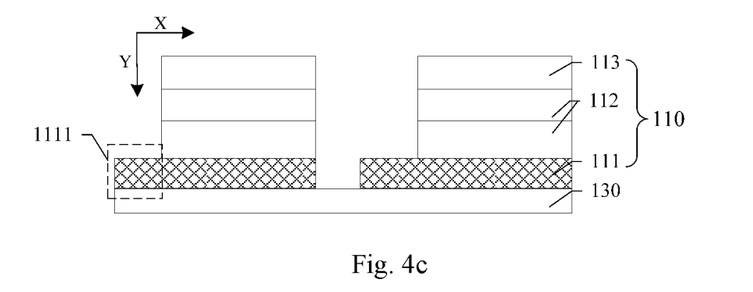

As illustrated by FIG. 4c, for example, the semiconductor layer 112, the conductive layer 113, and the graphene layer 111 are patterned.

For example, the semiconductor layer 112 and the conductive layer 113 are firstly patterned, so that the semiconductor layer 112 and the conductive layer 113 have the same shape and size. The present embodiment includes but is not limited thereto. It should be noted that, the present embodiment is described by taking a case where an orthographic projection of the conductive layer on the transfer substrate and an orthographic projection of the semiconductor layer on the transfer substrate are completely overlapped as an example. That is, the present embodiment is described by taking a case where the conductive layer is an entire surface electrode as an example. The present embodiment includes but is not limited thereto.

For example, the conductive layer can also be patterned to form a block electrode, and a material of the conductive layer can be either a transparent conductive material or an opaque conductive material, and the present embodiment is not limited thereto.

For example, after the semiconductor layer 112 and the conductive layer 113 are patterned, the graphene layer 111 is patterned. For example, the graphene layer 111 between two patterned semiconductor layers 112 which are adjacent in the X direction is patterned by a laser cutting method, so that the graphene layer 111 forms a protrusion portion 111 extending beyond the semiconductor layer 112 in the X direction parallel to the transfer substrate 130. The present embodiment is not limited thereto. For example, the semiconductor layer 112, the conductive layer 113, and the graphene layer 111 can also be patterned simultaneously to save processes.

Figure 4D:
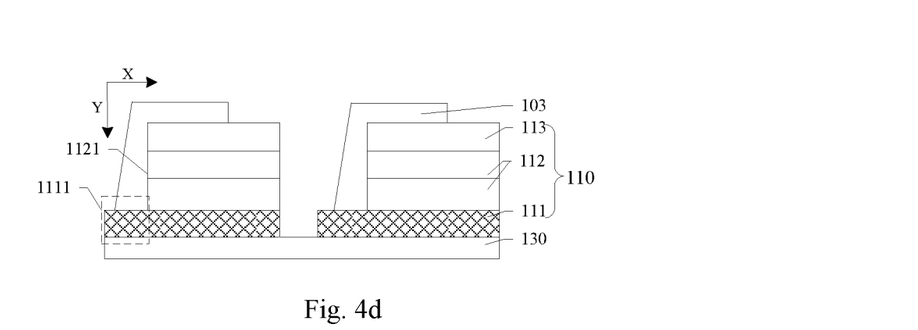

As illustrated by FIG. 4d, for example, a first protection layer 103 is formed on a part of an upper surface of the conductive layer 113, a lateral side 1121 of the semiconductor layer 112, and the protrusion portion 1111 of the graphene layer 111. The first protection layer 103 is configured to play a protection role on the light emitting diode 110 during a process of transferring the light emitting diode 110. The present embodiment includes but is not limited thereto. For example, the first protection layer can also be only located on a part of the upper surface of the conductive layer, or the first protection layer can also be located on a part of the upper surface of the conductive layer and a lateral side of the semiconductor layer.

S203: forming a self-assembled monolayer on a base substrate.

Figure 5:
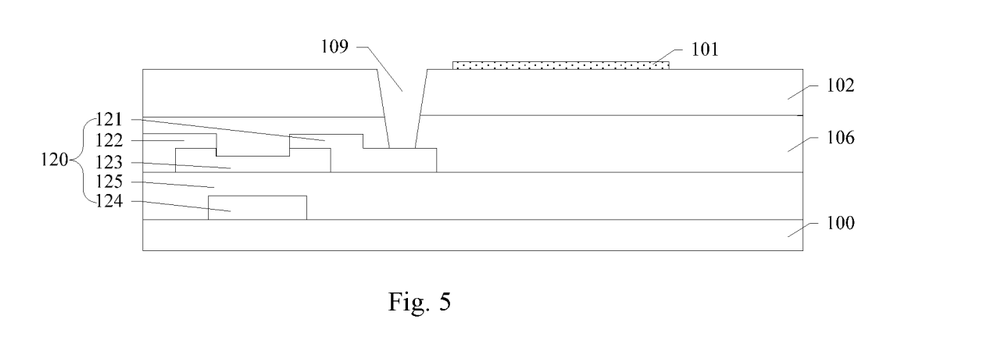
FIG. 5 is a schematic diagram of a thin film transistor backplane (TFT BP) provided by an embodiment of the present disclosure.

FIG. 5 is a schematic diagram of a thin film transistor backplane (TFT BP) provided by the present embodiment. As illustrated by FIG. 5, a thin film transistor 120 is formed on the base substrate 100. The thin film transistor 120 includes a drain electrode 121, a source electrode 122, an active layer 123, a gate electrode 124, and a gate insulating layer 125.

For example, a material of the drain electrode 121, the source electrode 122, and the gate electrode 124 in the thin film transistor 120 can include one or a combination of ones selected from the group consisting of molybdenum, titanium, aluminum, and copper, but is not limited thereto.

For example, a material of the gate insulating layer 125 can include silicon nitride, silicon oxide, or a combination of both, but is not limited thereto.

For example, a material of the active layer 123 can include amorphous silicon, an oxide semiconductor, or the like, but is not limited thereto.

For example, as illustrated by FIG. 5, a passivation layer 106 is formed on the thin film transistor 120. For example, a material of the passivation layer 106 can include silicon nitride, silicon oxide, a transparent organic insulating layer, or a combination of the three, but is not limited thereto.

For example, as illustrated by FIG. 5, an organic film 102 is formed on the passivation layer 106.

For example, a material of the organic film 102 can include polyimide, polycarbonate, polyacrylate, or the like, but the present embodiment is not limited thereto.

For example, a via hole 109 is formed in the organic film 102 by etching to form a thin film transistor backplane (TFT BP) as illustrated by FIG. 5.

For example, a methanol solution of 4-diazo-2,3,5,6-tetrafluorobenzoic acid ethylamine (TFPA-$NH_2$) with a concentration of 3 mg/mL-5 mg/mL is prepared, and a side of the organic film 102 of the thin film transistor backplane away from the base substrate 100 is socked in the methanol solution for no more than 2.5 hours after being treated by oxygen plasma for 1 minute. The organic film 102 generates active groups (e.g., –H) after being treated by oxygen plasma, and these active groups will be interconnected with the amino functional groups in TFPA-$NH_2$ by the effect of hydrogen bonds, so as to form the self-assembled monolayer 101.

For example, after self-assembly, the composite film is taken out of the solution and placed in a methanol solvent for 10 minutes to dissolve excess monolayer formed on the composite film, and then the film is dried with nitrogen and stored in a dark environment before a next process.

It should be noted that, the concentration of TFPA-$NH_2$ in the methanol solution should not be too high, otherwise the formed film is not a monolayer, but a multi-molecule layer; the soaking time should not be too long, otherwise the connection of the monolayer and the subsequent graphene layer will no longer be through a chemical bond, thus, the concentration of the solution and the soaking time should be strictly controlled.

It should be noted that the self-assembled monolayer formed in the present embodiment includes at least one type of organic molecule. The selected organic molecule is required to include an azide functional group and an amino functional group located at two ends thereof, and are not limited to TFPA-$NH_2$ (as illustrated by FIG. 2a). For example, the self-assembled monolayer can further include other molecules including an azide functional group and an amino functional group, and the present embodiment is not limited thereto.

S204: transferring the light emitting diode from the transfer substrate to the self-assembled monolayer, to connect the graphene layer to the self-assembled monolayer.

Figure 6A:
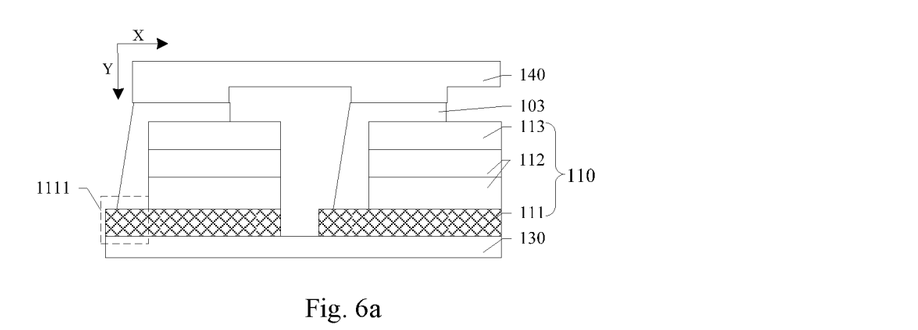
FIGS. 6a to 6b are schematic diagrams of a process of transferring the formed light emitting diode provided by an embodiment of the present disclosure.
Figure 6B:
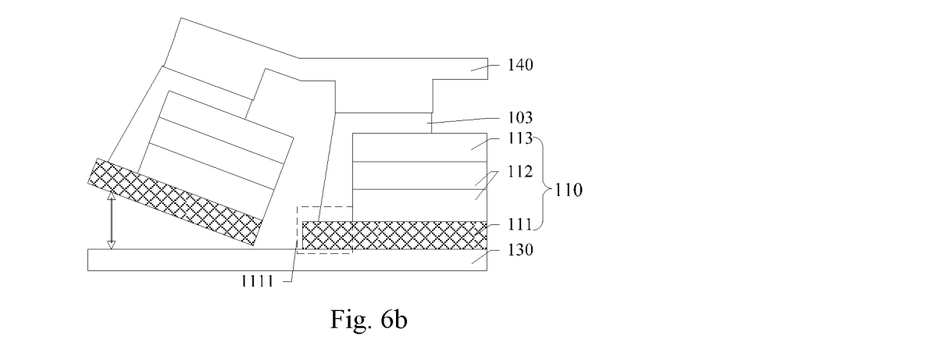

FIGS. 6a to 6b are schematic diagrams of a process of transferring the formed light emitting diode provided by the present embodiment. As illustrated by FIGS. 6a and 6b, a transfer device 140 is adopted to absorb the first protection layer 103, to take away the light emitting diode 110 from the transfer substrate 130.

For example, the transfer device 140 can include a suction portion (not shown in the figures) for absorbing the first protection layer 103 formed on the light emitting diode 110. The present embodiment is not limited thereto, and for example, a transfer device can also be adopted to clip a light emitting diode to transfer the light emitting diode to the base substrate. Because there is no connection of chemical bonds between the graphene layer 111 and the transfer substrate 130, and the connection between the graphene layer 111 and the transfer substrate 130 is a weak van der Waals force, the graphene layer 111 can be separated from the transfer substrate 130 by absorbing the first protection layer 103 through the transfer device 140. The separating state is illustrated by an arrow shown in FIG. 6b.

Figure 7:
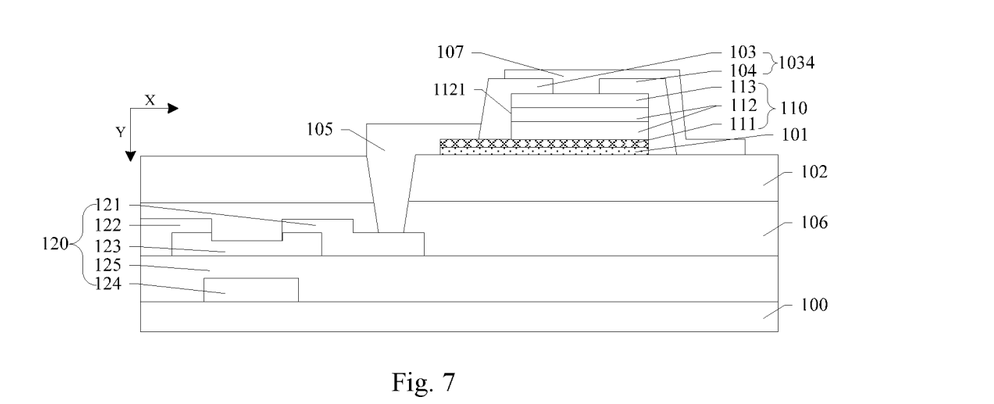
FIG. 7 is a schematic diagram of a process of transferring a light emitting diode to a base substrate provided by an embodiment of the present disclosure.

FIG. 7 is a schematic diagram of for a process of transferring a light emitting diode to a base substrate according to the present embodiment. As illustrated by FIG. 7, the light emitting diode 110 is transferred to the self-assembled monolayer 101, and the self-assembled monolayer 101 is heated to connect the azide functional group and the six-membered ring of the graphene molecule in the graphene layer 111 by a chemical bond.

For example, the azide functional group in the self-assembled monolayer 101 can be activated by a manner of heating or lighting to form a covalent bond with a carbon six-membered ring in the graphene molecule, the present embodiment includes but is not limited thereto. The self-assembled monolayer in the present embodiment serves as a connection medium between the light emitting diode and the base substrate, i.e., the graphene layer is connected with the organic film through the self-assembled monolayer in the form of a chemical bond, thereby increasing the connection strength between the light emitting diode and the base substrate, and having good mechanical reliability.

For example, a nano-imprinter can be adopted to heat the self-assembled monolayer 101. For example, the pressure of the nano-imprinter is controlled to be 500 psi, the temperature is set to be about 100° C., and the self-assembled monolayer is imprinted for 30 minutes, so that the azide functional group in the self-assembled monolayer 101 can be activated. The present embodiment is not limited thereto. For example, the azide functional group can also be activated by ultraviolet light to react with graphene.

For example, as illustrated by FIG. 7, after the light emitting diode 110 is transferred to the self-assembled monolayer 101, a contact electrode 105 is formed in the via hole 109 by a patterning process. The graphene layer 111 serves as an electrode of the light emitting diode 110, and its protrusion portion 1111 is electrically connected to the drain electrode 121 through the contact electrode 105. In a case where the thin film transistor 120 is turned on, current of the source electrode 122 is transmitted to the graphene layer 111 of the light emitting diode 110 through the drain electrode 121. The present embodiment includes but is not limited thereto. For example, another electrode can be further formed on the graphene layer to be electrically connected with the drain of the thin film transistor, and the graphene layer only serves as a substrate for forming the light emitting diode and is transferred to the base substrate together with the light emitting diode.

For example, as illustrated by FIG. 7, a second protection layer 104 is formed at a position on another lateral side opposite to a lateral side 1121 of the semiconductor layer 112 in the X direction, and the second protection layer 104 and the first protection layer 103 form a protection layer 1034 as a whole.

For example, a transparent conductive material such as indium tin oxide is deposited on the protection layer 1034 and the organic film 102, and is patterned to form a common electrode 107, the common electrode 107 is electrically connected with the conductive layer 113 of the light emitting diode 110. The second protection layer 104 in the present embodiment is configured to prevent the graphene layer 111 from being electrically connected to the common electrode 107. It should be noted that the present embodiment is described by taking a case where the second protection layer is formed on a part of an upper surface of the conductive layer and lateral sides of the semiconductor layer and the graphene layer as an example. The present embodiment is not limited thereto.

For example, upon the conductive layer being a block electrode, the second protection layer can be formed on a part of an upper surface of the semiconductor layer, lateral sides of the semiconductor layer, the graphene layer, or the like.

For example, an encapsulation layer 108 (not shown in FIG. 7, as shown in FIG. 1) is formed on the light emitting diode. For example, a material for forming the encapsulation layer 108 can include silicon dioxide, but the present embodiment is not limited thereto, for example, a transparent organic material or the like can also be included.

For example, a thickness of the formed encapsulating layer 108 in the Y direction is not less than an overall thickness of the light emitting diode 110 and the protection layer 1034 in the Y direction, that is, the thickness of the encapsulating layer 108 in the Y direction is not less than 3-4 micrometers. The present embodiment is not limited thereto.

Figure 8:
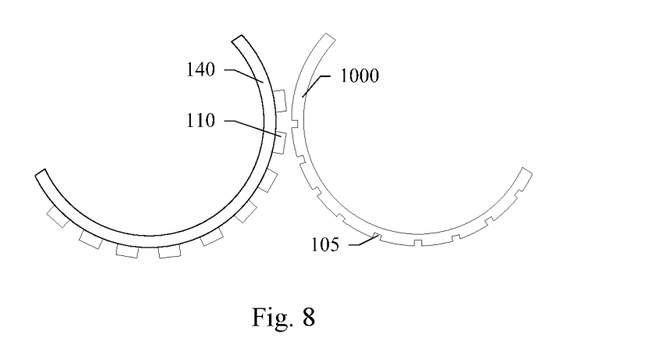
FIG. 8 is a schematic diagram of a process of transferring a light emitting diode to a self-assembled monolayer by a roll-to-roll process provided by an embodiment of the present disclosure.

FIG. 8 is a schematic diagram of transferring a light emitting diode to a self-assembled monolayer by a roll-to-roll process according to the present embodiment. As illustrated by FIG. 8, for example, the transfer device 140 can be designed with a shape of a roller, or a "stamp" used for absorbing the light emitting diode 110 can be located on the roller as illustrated by FIG. 8, and the thin film transistor backplane 1000 can also be located on another roller. It should be noted that a material of the base substrate needs to be a flexible material.

For example, the transfer device 140 with the shape of a roller in the roll-to-roll device includes a suction portion (not shown in FIG. 8) for absorbing the plurality of light emitting diodes 110. The present embodiment includes not limited thereto, for example, the transfer device 140 can have a clipping portion for clipping the plurality of light emitting diodes.

For example, the transfer device 140 with the shape of a roller in the roll-to-roll device further includes a heating portion (not shown) for heating the self-assembled monolayer on the thin film transistor backplane 1000 to activate the azide functional group thereon, so as to form a chemical bond between the azide functional group and the carbon six-membered ring in the graphene molecule in the graphene layer. Here, the self-assembled monolayer serves as a connection medium between the light emitting diode and the base substrate, thereby increasing the connection strength between the light emitting diode and the base substrate, and having good mechanical reliability. Because the embodiments of the present disclosure adopt graphene as a medium for performing a roll-to-roll carrier transfer process, and complete the chemical bond connection between the self-assembled monolayer and the graphene layer during the process of transferring the light emitting diode, the working efficiency of the manufacturing method can be improved. The present embodiment is not limited to the roll-to-roll process, and other processes for transferring light emitting diodes can also be adopted.

An embodiment of the present disclosure provides a display device. The display device includes the light emitting diode display substrate provided in any one of the above embodiments. The light emitting diode in the display device is connected with the base substrate by a chemical bond, thereby having good mechanical reliability.

For example, the display device can be a display device such as a light emitting diode display device, an OLED (Organic Light-Emitting Diode) display device, and any products or components having a display function such as a television, a digital camera, a mobile phone, a watch, a tablet computer, a notebook computer, a navigator including the display device. The present embodiment is not limited thereto.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A light emitting diode display substrate, comprising:
   a base substrate;
   a light emitting diode, located on the base substrate, wherein the light emitting diode comprises a graphene layer, and the graphene layer is a layer of the light emitting diode closest to the base substrate; and
   a self-assembled monolayer, located between the graphene layer and the base substrate and connected with the graphene layer,
   wherein the self-assembled monolayer comprises at least one type of organic molecule, two ends of the organic molecule comprise an azide functional group and an amino functional group respectively, and the azide functional group and a graphene molecule in the graphene layer are connected by a chemical bond.

2. The light emitting diode display substrate according to claim 1, wherein the organic molecule comprises 4-diazo-2,3,5,6-tetrafluorobenzoic acid ethylamine.

3. The light emitting diode display substrate according to claim 1, further comprising:
   an organic film, located between the self-assembled monolayer and the base substrate, and connected with the amino functional group in the self-assembled monolayer by a hydrogen bond.

4. The light emitting diode display substrate according to claim 1, wherein the light emitting diode further comprises a semiconductor layer located at a side of the graphene layer opposite from the self-assembled monolayer and a conductive layer located at a side of the semiconductor layer opposite from the graphene layer.

5. The light emitting diode display substrate according to claim 4, wherein the semiconductor layer is a gallium nitride based semiconductor layer.

6. The light emitting diode display substrate according to claim 4, further comprising:
   a protection layer, located on a part of an upper surface of the conductive layer opposite from the semiconductor layer.

7. The light emitting diode display substrate according to claim 6, wherein the graphene layer comprises a protrusion portion extending beyond the semiconductor layer in a first direction parallel to the base substrate, and the protection layer is located on a lateral side of the semiconductor layer and connected to the protrusion portion of the graphene layer.

8. The light emitting diode display substrate according to claim 1, further comprising:
   a thin film transistor, comprising a drain electrode,
   wherein the drain electrode is electrically connected with the graphene layer.

9. The light emitting diode display substrate according to claim 1, wherein the light emitting diode has a size in a range from 1 μm to 100 μm.

10. A display device, comprising the light emitting diode display substrate according to claim 1.

11. A manufacturing method of a light emitting diode display substrate, comprising:
    forming a graphene layer on a transfer substrate;
    forming a semiconductor layer and a conductive layer sequentially at a side of the graphene layer opposite from the transfer substrate to form a light emitting diode;
    forming a self-assembled monolayer on a base substrate; and
    transferring the light emitting diode from the transfer substrate to the self-assembled monolayer, to connect the graphene layer to the self-assembled monolayer,
    wherein the self-assembled monolayer comprises at least one type of organic molecule, two ends of the organic molecule comprise an azide functional group and an amino functional group respectively, and
    the azide functional group and a graphene molecule in the graphene layer are connected by a chemical bond.

12. The manufacturing method of the light emitting diode display substrate according to claim 11, wherein, before transferring the light emitting diode from the transfer substrate, the method comprises:
    forming a protection layer on a part of an upper surface of the conductive layer opposite from the semiconductor layer.

13. The manufacturing method of the light emitting diode display substrate according to claim 12, wherein the graphene layer comprises a protrusion portion extending beyond the semiconductor layer in a first direction parallel to the transfer substrate,
    wherein, before transferring the light emitting diode from the transfer substrate, the method further comprises:
    forming the protection layer on a lateral side of the semiconductor layer and the protrusion portion of the graphene layer.

14. The manufacturing method of the light emitting diode display substrate according to claim 12, wherein transferring the light emitting diode from the transfer substrate to the self-assembled monolayer comprises:
    absorbing the protection layer by a transfer device to take away the light emitting diode from the transfer substrate and place it on the self-assembled monolayer, and heating the self-assembled monolayer to connect the azide functional group and the graphene molecule of the graphene layer by the chemical bond.

15. The manufacturing method of the light emitting diode display substrate according to claim 11, wherein forming the self-assembled monolayer on the base substrate comprises:
    forming an organic film on the base substrate, performing a treatment to a surface of the organic film, and forming the self-assembled monolayer on the organic film to connect the amino functional group in the self-assembled monolayer and the organic film by a hydrogen bond.

16. The manufacturing method of the light emitting diode display substrate according to claim 11, wherein transferring the light emitting diode to the self-assembled monolayer by a roll-to-roll process.

17. A light emitting diode display substrate, comprising:
    a base substrate;
    a light emitting diode, located on the base substrate, wherein the light emitting diode comprises a graphene layer, and the graphene layer is a layer of the light emitting diode closest to the base substrate; and
    a self-assembled monolayer, located between the graphene layer and the base substrate and connected with the graphene layer;
    wherein the light emitting diode further comprises a semiconductor layer located at a side of the graphene layer opposite from the self-assembled monolayer and a conductive layer located at a side of the semiconductor layer opposite from the graphene layer;
    the light emitting diode display substrate further comprising:

a protection layer, located on a part of an upper surface of the conductive layer opposite from the semiconductor layer;

wherein the graphene layer comprises a protrusion portion extending beyond the semiconductor layer in a first direction parallel to the base substrate, and the protection layer is located on a lateral side of the semiconductor layer and connected to the protrusion portion of the graphene layer.

18. The light emitting diode display substrate according to claim 17, further comprising:

an organic film, located between the self-assembled monolayer and the base substrate, and connected with the amino functional group in the self-assembled monolayer by a hydrogen bond.

* * * * *